(12) United States Patent
Samela et al.

(10) Patent No.: US 6,220,873 B1
(45) Date of Patent: Apr. 24, 2001

(54) MODIFIED CONTACT TRACES FOR INTERFACE CONVERTER

(75) Inventors: Francis M. Samela, Lombard; Raul Medina, Chicago; Joseph R. Llorens, Winfield, all of IL (US)

(73) Assignee: Stratos Lightwave, Inc., Chicago, IL (US)

( * ) Notice: Subject to any disclaimer, the term of this patent is extended or adjusted under 35 U.S.C. 154(b) by 0 days.

(21) Appl. No.: 09/371,483

(22) Filed: Aug. 10, 1999

(51) Int. Cl.$^7$ .............................. H01R 12/00; H05K 1/00
(52) U.S. Cl. ........................................ 439/76.1; 439/924.1
(58) Field of Search ............................... 439/76.1, 924.1

(56) References Cited

U.S. PATENT DOCUMENTS

| Re. 32,502 | * | 9/1987 | Kumar ............................ 439/92 |
| 2,899,669 | * | 8/1959 | Johanson . |
| 3,264,601 | * | 8/1966 | Hartholz . |
| 3,332,860 | * | 7/1967 | Diebold et al. . |
| 3,474,380 | * | 10/1969 | Miller . |
| 3,497,866 | * | 2/1970 | Patton, Jr. . |
| 3,670,290 | * | 6/1972 | Angele et al. . |
| 3,673,545 | * | 6/1972 | Rundle . |
| 3,737,729 | * | 6/1973 | Carney ...................... 317/101 PH |
| 3,792,284 | * | 2/1974 | Kaelin ............................ 250/551 |
| 3,805,116 | * | 4/1974 | Nehmann ........................ 317/99 |
| 3,809,908 | * | 5/1974 | Clanton .......................... 250/217 |
| 3,976,877 | * | 8/1976 | Thillays ......................... 250/227 |
| 3,990,761 | * | 11/1976 | Jayne . |
| 4,149,072 | * | 4/1979 | Smith et al. .................... 250/199 |
| 4,156,903 | * | 5/1979 | Barton et al. .................. 340/172.5 |
| 4,161,650 | * | 7/1979 | Caoutte et al. ................. 250/199 |
| 4,176,897 | * | 12/1979 | Cameron . |
| 4,217,488 | * | 8/1980 | Hubbard . |
| 4,226,491 | * | 10/1980 | Kazoma et al. . |
| 4,234,968 | * | 11/1980 | Singh ............................ 455/607 |
| 4,249,266 | * | 2/1981 | Nakamori ...................... 455/608 |
| 4,252,402 | * | 2/1981 | Puech et al. ................... 350/96.14 |
| 4,257,124 | * | 3/1981 | Porter et al. ................... 455/601 |
| 4,268,756 | * | 5/1981 | Crouse et al. .................. 250/551 |
| 4,273,413 | * | 6/1981 | Bendiksen et al. ............. 350/96.2 |
| 4,276,656 | * | 6/1981 | Petruk, Jr. ..................... 455/608 |

(List continued on next page.)

FOREIGN PATENT DOCUMENTS 0 228 278 * 12/1986 (EP) .
0 305112 A2 * 8/1988 (EP) .

(List continued on next page.)

OTHER PUBLICATIONS

AMP "PC Board Connectors" Product Catalog 82759 published Jun. 1991.*

(List continued on next page.)

Primary Examiner—Brian Sircus
Assistant Examiner—Hae Moon Hyeon
(74) Attorney, Agent, or Firm—Steven M. Evans; David L. Newman

(57) ABSTRACT

The invention relates to an interface module, such as a Giga-Bit Interface Converter module, provided to mate within a host device chassis where, at the rear of the mounting slot, a first connector engages a host socket of the host device. According to the invention, the first connector include sequential mating contact traces on a contact beam of a substrate such that when the module is inserted into the corresponding host socket, certain contacts are connected in a pre-defined sequence such that a first set of contacts electrically engages prior to a second set of contacts which electrically engages prior to a third set of contacts. In further accord with the present invention, the first set of contacts includes grounding contacts, the second set includes contacts for powering the substrate and the third set includes signal contacts. An advantage of this sequence is that the GBIC is grounded before it is powered and powered before it begins passing signals thus eliminating the damage to the GBIC encountered under the GBIC-to-host contact sequence given in the prior art GBIC specification.

14 Claims, 8 Drawing Sheets

U.S. PATENT DOCUMENTS

| | | | | |
|---|---|---|---|---|
| 4,294,682 | * | 10/1981 | Deczky | 204/244 |
| 4,295,181 | * | 10/1981 | Change et al. | 361/395 |
| 4,301,543 | * | 11/1981 | Palmer | 455/612 |
| 4,330,870 | * | 5/1982 | Arends | 455/617 |
| 4,345,808 | * | 8/1982 | Ingham | 29/589 |
| 4,347,655 | * | 9/1982 | Zory et al. | 29/589 |
| 4,357,606 | * | 11/1982 | Fortescue | 340/870.01 |
| 4,360,248 | * | 11/1982 | Bickel et al. | 350/96.16 |
| 4,366,565 | * | 12/1982 | Herskowitz | 370/1 |
| 4,369,494 | * | 1/1983 | Bienvenn et al. | 364/200 |
| 4,380,360 | * | 4/1983 | Parmer et al. | 361/383 |
| 4,388,671 | * | 6/1983 | Hall et al. | 455/608 |
| 4,398,073 | * | 8/1983 | Botz et al. | 455/607 |
| 4,399,563 | * | 8/1983 | Greenberg | 364/200 |
| 4,408,273 | * | 10/1983 | Plow | 357/19 |
| 4,422,088 | * | 12/1983 | Gfeller | 357/19 |
| 4,427,879 | * | 1/1984 | Becher et al. | 250/215 |
| 4,430,699 | * | 2/1984 | Segarra et al. | 350/96.21 |
| 4,432,604 | * | 2/1984 | Schwab | 350/96.21 |
| 4,437,190 | * | 3/1984 | Rozenwaig et al. | 455/600 |
| 4,439,006 | * | 3/1984 | Stevenson | 350/96.2 |
| 4,446,515 | * | 5/1984 | Sauer et al. | 364/200 |
| 4,449,244 | * | 5/1984 | Kopainsky | 455/603 |
| 4,451,036 | * | 5/1984 | Landries et al. | 361/426 |
| 4,453,813 | * | 6/1984 | McNaughton et al. | 350/96.2 |
| 4,453,903 | * | 6/1984 | Pukoite | 425/117 |
| 4,459,658 | * | 7/1984 | Gabbe et al. | 364/200 |
| 4,461,537 | * | 7/1984 | Raymer, II, et al. | 350/96.2 |
| 4,470,154 | * | 9/1984 | Yano | 455/607 |
| 4,486,059 | * | 12/1984 | DeYoung . | |
| 4,493,113 | * | 1/1985 | Forrest et al. | 455/606 |
| 4,501,021 | * | 2/1985 | Weizzq | 455/601 |
| 4,506,937 | * | 3/1985 | Cosmos et al. . | |
| 4,510,553 | * | 4/1985 | Faultersack | 361/413 |
| 4,511,207 | * | 4/1985 | Newton et al. | 350/96.15 |
| 4,514,586 | * | 4/1985 | Waggoner | 174/35 |
| 4,516,204 | * | 5/1985 | Sauer et al. | 364/200 |
| 4,519,670 | * | 5/1985 | Spinner et al. | 350/46.15 |
| 4,519,672 | * | 5/1985 | Rogstadius | 350/96.2 |
| 4,519,673 | * | 5/1985 | Hamilton | 350/96.32 |
| 4,522,463 | * | 6/1985 | Schwenda et al. | 350/96.21 |
| 4,526,438 | * | 7/1985 | Essert | 350/96.2 |
| 4,526,986 | * | 7/1985 | Fields et al. | 549/254 |
| 4,527,286 | * | 7/1985 | Haworth | 455/601 |
| 4,529,266 | * | 7/1985 | Delebecque | 350/96.23 |
| 4,530,566 | * | 7/1985 | Smith et al. | 350/96.2 |
| 4,531,810 | * | 7/1985 | Carlsen | 350/96.2 |
| 4,533,208 | * | 8/1985 | Stowe . | |
| 4,533,209 | * | 8/1985 | Segerson | 350/96.16 |
| 4,533,616 | * | 8/1985 | Rayburn et al. | 219/121 LH |
| 4,534,616 | * | 8/1985 | Bowen et al. | 350/96.2 |
| 4,534,617 | * | 8/1985 | Klootz et al. | 350/96.2 |
| 4,535,233 | * | 8/1985 | Abraham | 250/214 |
| 4,537,468 | * | 8/1985 | Begoix et al. | 350/96.21 |
| 4,539,476 | * | 9/1985 | Donuma et al. | 250/227 |
| 4,540,237 | * | 9/1985 | Winzer | 350/96.15 |
| 4,540,246 | * | 9/1985 | Fantone | 350/514 |
| 4,541,685 | * | 9/1985 | Anderson | 350/96.21 |
| 4,542,076 | * | 9/1985 | Bednarz et al. | 4289/624 |
| 4,544,231 | * | 10/1985 | Peterson | 350/96.15 |
| 4,544,233 | * | 10/1985 | Iwamoto et al. | 350/96.21 |
| 4,544,234 | * | 10/1985 | DeVeau, Jr., et al. | 350/96.21 |
| 4,545,074 | * | 10/1985 | Balliet et al. | 455/601 |
| 4,545,077 | * | 10/1985 | Drapala et al. | 455/612 |
| 4,545,642 | * | 10/1985 | Auracher et al. | 350/96.2 |
| 4,545,643 | * | 10/1985 | Young | 350/96.19 |
| 4,545,644 | * | 10/1985 | De Veau, Jr. et al. | 350/96.21 |
| 4,545,645 | * | 10/1985 | Mignien | 350/96.21 |
| 4,548,466 | * | 10/1985 | Evans et al. | 350/96.2 |
| 4,548,467 | * | 10/1985 | Stoerk | 350/96.21 |
| 4,549,783 | * | 10/1985 | Schmachtenberg III | 350/96.2 |
| 4,550,975 | * | 11/1985 | Levinson et al. | 350/96.18 |
| 4,553,811 | * | 11/1985 | Becker decreased, et al. | 350/96.2 |
| 4,553,814 | * | 11/1985 | Bahl et al. | 350/96.21 |
| 4,556,279 | * | 12/1985 | Shaw et al. | 350/96.15 |
| 4,556,281 | * | 12/1985 | Anderton | 350/96.2 |
| 4,556,282 | * | 12/1985 | Delebeque | 350/96.21 |
| 4,557,551 | * | 12/1985 | Dyott | 350/96.15 |
| 4,560,234 | * | 12/1985 | Shaw et al. | 350/96.18 |
| 4,563,057 | * | 1/1986 | Ludman et al. | 350/96.18 |
| 4,566,753 | * | 1/1986 | Mannschke | 350/96.16 |
| 4,568,145 | * | 2/1986 | Colin | 350/96.2 |
| 4,569,569 | * | 2/1986 | Stewart | 350/96.2 |
| 4,573,760 | * | 3/1986 | Fan | 455/618 |
| 4,580,295 | * | 4/1986 | Bhatt et al. | 350/96.16 |
| 4,588,256 | * | 5/1986 | Onstott et al. | 350/96.21 |
| 4,589,728 | * | 5/1986 | Dyott et al. | 350/96.3 |
| 4,595,839 | * | 6/1986 | Braun et al. | 250/551 |
| 4,597,631 | * | 7/1986 | Flores | 350/96.2 |
| 4,612,670 | * | 9/1986 | Henderson | 455/607 |
| 4,614,836 | * | 9/1986 | Carpenter et al. | 174/51 |
| 4,625,333 | * | 11/1986 | Takezawa et al. | 455/612 |
| 4,629,270 | * | 12/1986 | Andrews, Jr., et al. | 339/75 |
| 4,634,239 | * | 1/1987 | Buhrer | 350/486 |
| 4,641,371 | * | 2/1987 | Shutterly | 455/601 |
| 4,647,148 | * | 3/1987 | Katagiri | 350/96.2 |
| 4,652,976 | * | 3/1987 | Fushimoto | 361/393 |
| 4,663,240 | * | 5/1987 | Hajdu et al. | 428/545 |
| 4,663,603 | * | 5/1987 | Van Riemskijk et al. | 336/60 |
| 4,678,264 | * | 7/1987 | Bowen et al. | 350/96.2 |
| 4,679,883 | * | 7/1987 | Assini et al. | 439/607 |
| 4,695,106 | * | 9/1987 | Feldman et al. | 439/83 |
| 4,697,864 | * | 10/1987 | Hayes et al. | 439/444 |
| 4,708,433 | * | 11/1987 | Kakii et al. | 350/96.22 |
| 4,720,630 | * | 1/1988 | Takeuchi et al. | 250/227 |
| 4,722,584 | * | 2/1988 | Takii et al. | 350/96.2 |
| 4,727,248 | * | 2/1988 | Meur et al. | 250/239 |
| 4,737,008 | * | 4/1988 | Ohyama et al. | 350/96.2 |
| 4,762,388 | * | 8/1988 | Tanaka et al. | 350/96.2 |
| 4,772,931 | * | 9/1988 | Rogers | 357/30 |
| 4,789,218 | * | 12/1988 | Paul et al. | 350/96.21 |
| 4,798,430 | * | 1/1989 | Johnson et al. | 350/96.2 |
| 4,798,440 | * | 1/1989 | Hoffer et al. | 350/96.2 |
| 4,807,006 | * | 2/1989 | Rogers et al. | 357/30 |
| 4,807,955 | * | 2/1989 | Ashman et al. | 350/96.2 |
| 4,811,165 | * | 3/1989 | Currier et al. | 361/386 |
| 4,812,133 | * | 3/1989 | Fleak et al. | 439/248 |
| 4,838,630 | * | 6/1989 | Iannson | 350/3.7 |
| 4,840,451 | * | 6/1989 | Sampson et al. . | |
| 4,844,581 | * | 7/1989 | Turner | 350/96.2 |
| 4,847,771 | * | 7/1989 | Inove | 364/431.05 |
| 4,849,944 | * | 7/1989 | Matsushita | 371/21 |
| 4,857,002 | * | 8/1989 | Jensen et al. | 439/76 |
| 4,872,736 | * | 10/1989 | Myers et al. | 350/96.2 |
| 4,881,789 | * | 11/1989 | Levinson | 350/96.15 |
| 4,884,336 | * | 12/1989 | Waters et al. | 29/845 |
| 4,897,711 | * | 1/1990 | Blonder et al. | 357/74 |
| 4,906,197 | * | 3/1990 | Noll | 439/79 |
| 4,913,511 | * | 4/1990 | Talbalba et al. | 350/96.2 |
| 4,927,225 | * | 5/1990 | Levinson | 350/96.18 |
| 4,945,229 | * | 7/1990 | Daly et al. | 250/227.11 |
| 4,953,939 | * | 9/1990 | Basista et al. | 350/96.2 |
| 4,977,329 | * | 12/1990 | Eckhardt et al. | 250/551 |
| 4,979,787 | * | 12/1990 | Lichenberger | 350/96.2 |
| 4,986,625 | * | 1/1991 | Yamada et al. | 350/96.2 |
| 4,989,934 | * | 2/1991 | Zacracky et al. | 350/96.11 |
| 4,990,104 | * | 2/1991 | Schieferly | 439/578 |
| 5,004,434 | * | 4/1991 | Aiello et al. | 439/636 |
| 5,005,939 | * | 4/1991 | Arvanitakis et al. | 350/96.2 |
| 5,006,286 | * | 4/1991 | Dery et al. | 264/40.2 |
| 5,011,246 | * | 4/1991 | Corradetti et al. | 350/96.2 |

| Patent No. | Date | Inventor | Class |
|---|---|---|---|
| 5,011,425 * | 4/1991 | Van Zanten et al. | 439/353 |
| 5,013,247 * | 5/1991 | Watson | 439/55 |
| 5,019,769 * | 5/1991 | Levinson | 372/31 |
| 5,035,482 * | 7/1991 | Ten Berge | 350/96.2 |
| 5,039,194 * | 8/1991 | Block et al. | 383/88 |
| 5,043,775 * | 8/1991 | Wai-Hon Lee | 357/19 |
| 5,045,971 * | 9/1991 | Ono et al. | 361/386 |
| 5,046,955 * | 9/1991 | Olsson | 439/74 |
| 5,047,835 * | 9/1991 | Chang | 357/74 |
| 5,060,373 * | 10/1991 | Machura et al. | 29/858 |
| 5,082,344 * | 1/1992 | Mulholland et al. | 385/60 |
| 5,084,802 * | 1/1992 | Nguyenngoc | 361/424 |
| 5,086,422 * | 2/1992 | Hagiya et al. | 369/75.1 |
| 5,091,991 * | 2/1992 | Briggs et al. | 385/82 |
| 5,093,879 * | 3/1992 | Bregman et al. | 385/93 |
| 5,094,623 * | 3/1992 | Scharf et al. | 439/607 |
| 5,099,307 * | 3/1992 | Go et al. | 357/70 |
| 5,101,463 * | 3/1992 | Cubukciyan et al. | 385/72 |
| 5,104,243 * | 4/1992 | Harding | 385/84 |
| 5,107,404 * | 4/1992 | Tam | 361/424 |
| 5,108,294 * | 4/1992 | Marsh et al. | 439/76 |
| 5,109,453 * | 4/1992 | Edwards et al | 385/90 |
| 5,113,466 * | 5/1992 | Acarlar et al. | 385/88 |
| 5,113,467 * | 5/1992 | Peterson et al. | 385/88 |
| 5,118,362 * | 6/1992 | St. Angelo et al. | 136/256 |
| 5,120,578 * | 6/1992 | Chen et al. | 427/304 |
| 5,122,893 * | 6/1992 | Tolbert | 359/152 |
| 5,124,885 * | 6/1992 | Liu | 361/391 |
| 5,125,849 * | 6/1992 | Briggs et al. | 439/378 |
| 5,127,071 * | 6/1992 | Go | 385/73 |
| 5,134,677 * | 7/1992 | Leung et al. | 385/84 |
| 5,136,152 * | 8/1992 | Lee | 250/211 |
| 5,136,603 * | 8/1992 | Hasnain et al. | 372/50 |
| 5,138,537 * | 8/1992 | Wang | 362/187 |
| 5,138,678 * | 8/1992 | Briggs et al. | 385/86 |
| 5,155,786 * | 10/1992 | Ecker et al. | 385/94 |
| 5,168,537 * | 12/1992 | Rajasekharan et al. | 385/89 |
| 5,170,146 * | 12/1992 | Gardner | 338/313 |
| 5,183,404 * | 2/1993 | Aldous et al. | 439/55 |
| 5,183,405 * | 2/1993 | Elicker et al. | 439/108 |
| 5,202,943 * | 4/1993 | Carden et al. | 385/92 |
| 5,212,752 * | 5/1993 | Stephenson et al. | 385/78 |
| 5,218,519 * | 6/1993 | Welch et al. | 361/415 |
| 5,225,760 * | 7/1993 | Leiserson | 320/2 |
| 5,234,353 * | 8/1993 | Scholz et al. | 439/289 |
| 5,238,426 * | 8/1993 | Arnett | 439/557 |
| 5,241,614 * | 8/1993 | Ecker et al. | 385/94 |
| 5,243,678 * | 9/1993 | Schaffer et al. | 385/134 |
| 5,247,532 * | 9/1993 | Levinson | 372/38 |
| 5,259,052 * | 11/1993 | Briggs et al. | 385/78 |
| 5,259,054 * | 11/1993 | Benzoni et al. | 3895/89 |
| 5,262,923 * | 11/1993 | Levinson | 385/46 |
| 5,274,729 * | 12/1993 | King et al. | 385/134 |
| 5,280,191 * | 1/1994 | Chang | 257/712 |
| 5,285,466 * | 2/1994 | Tabatabaie | 372/50 |
| 5,285,511 * | 2/1994 | Akkapeddi et al. | 385/89 |
| 5,285,512 * | 2/1994 | Duncan et al. | 385/94 |
| 5,289,345 * | 2/1994 | Corradetti et al. | 361/752 |
| 5,295,214 * | 2/1994 | Card et al. | 385/92 |
| 5,296,813 * | 3/1994 | Holmes et al. | 324/322 |
| 5,304,069 * | 4/1994 | Brunker et al. | 439/108 |
| 5,305,182 * | 4/1994 | Chen | 361/684 |
| 5,315,679 * | 5/1994 | Baldwin et al. | 385/76 |
| 5,317,663 * | 5/1994 | Beard et al. | 385/70 |
| 5,325,454 * | 6/1994 | Rittle et al. | 385/76 |
| 5,333,221 * | 7/1994 | Briggs et al. | 385/55 |
| 5,333,225 * | 7/1994 | Jacobowitz et al. | 385/93 |
| 5,337,391 * | 8/1994 | Lebby | 385/88 |
| 5,337,396 * | 8/1994 | Chen et al. | 385/92 |
| 5,337,398 * | 8/1994 | Benzoni et al. | 385/90 |
| 5,345,524 * | 9/1994 | Lebby et al. | 385/88 |
| 5,345,530 * | 9/1994 | Lebby et al. | 385/88 |
| 5,356,300 * | 10/1994 | Costello et al. | 439/101 |
| 5,357,402 * | 10/1994 | Anhalt . | |
| 5,361,244 * | 11/1994 | Nakumura et al. | 369/44.23 |
| 5,366,664 * | 11/1994 | Varaden et al. | 252/512 |
| 5,375,040 * | 12/1994 | Cooper et al. | 361/730 |
| 5,383,793 * | 1/1995 | Hsu et al. | 439/327 |
| 5,397,242 * | 3/1995 | Laisne et al. | 439/101 |
| 5,398,295 * | 3/1995 | Chang et al. | 385/58 |
| 5,414,787 * | 5/1995 | Kurata | 385/92 |
| 5,416,668 * | 5/1995 | Benzoni | 361/816 |
| 5,416,870 * | 5/1995 | Chun et al. | 385/88 |
| 5,416,871 * | 5/1995 | Takahashi et al. | 385/88 |
| 5,416,872 * | 5/1995 | Sizer II et al. | 385/92 |
| 5,428,703 * | 6/1995 | Lee | 385/78 |
| 5,428,704 * | 6/1995 | Lebby et al. | 385/92 |
| 5,432,630 * | 7/1995 | Lebby et al. | 359/152 |
| 5,434,747 * | 7/1995 | Shibata | 361/753 |
| 5,446,814 * | 8/1995 | Kuo et al. | 382/31 |
| 5,452,387 * | 9/1995 | Chun et al. | 385/88 |
| 5,455,703 * | 10/1995 | Duncan et al. | 359/152 |
| 5,469,332 * | 11/1995 | Alvite | 361/737 |
| 5,470,259 * | 11/1995 | Kaufman et al. | 439/607 |
| 5,475,734 * | 12/1995 | McDonald et al. | 379/58 |
| 5,477,418 * | 12/1995 | MacGregor et al. | 361/737 |
| 5,478,253 * | 12/1995 | Biechler et al. | 439/181 |
| 5,479,288 * | 12/1995 | Ishizuka et al. | 359/163 |
| 5,482,658 * | 1/1996 | Lebby et al. | 264/1.24 |
| 5,487,678 * | 1/1996 | Tsuji et al. | 439/352 |
| 5,491,712 * | 2/1996 | Lin et al. | 372/50 |
| 5,499,311 * | 3/1996 | DeCusatis | 385/89 |
| 5,515,468 * | 5/1996 | DeAndrea et al. | 385/88 |
| 5,528,408 * | 6/1996 | McGinley et al. | 359/152 |
| 5,535,034 * | 7/1996 | Taniguchi | 359/152 |
| 5,535,296 * | 7/1996 | Uchida | 385/89 |
| 5,546,281 * | 8/1996 | Poplawski | 361/752 |
| 5,547,385 * | 8/1996 | Spangler | 439/101 |
| 5,548,677 * | 8/1996 | Kakii et al. | 385/92 |
| 5,550,941 * | 8/1996 | Lebby et al. | 385/49 |
| 5,554,037 * | 9/1996 | Uleski | 439/76.1 |
| 5,561,727 * | 10/1996 | Akita et al. | 385/88 |
| 5,567,167 * | 10/1996 | Hayaski | 439/75 |
| 5,577,064 * | 11/1996 | Swirhun et al. | 372/96 |
| 5,580,269 * | 12/1996 | Fan | 439/79 |
| 5,596,663 * | 1/1997 | Ishibashi et al. | 385/92 |
| 5,598,319 * | 1/1997 | Lee | 361/684 |
| 5,599,595 * | 2/1997 | McGinley et al. | 428/33 |
| 5,600,470 * | 2/1997 | Walsh | 359/152 |
| 5,604,831 * | 2/1997 | Dittman et al. | 385/88 |
| 5,629,919 * | 5/1997 | Hayashi et al. | 369/112 |
| 5,631,998 * | 5/1997 | Han | 386/88 |
| 5,675,428 * | 10/1997 | Henmi | 359/161 |
| 5,687,267 * | 11/1997 | Uchida | 385/89 |
| 5,717,533 * | 2/1998 | Poplawski et al. | 361/752 |
| 5,724,729 * | 3/1998 | Sherif et al. | 29/840 |
| 5,734,558 * | 3/1998 | Poplawski et al. | 361/752 |
| 5,736,782 * | 4/1998 | Schairer | 257/679 |
| 5,767,999 * | 6/1998 | Kayner | 359/163 |
| 5,779,504 * | 7/1998 | Dominiak et al. | 439/709 |
| 5,879,173 * | 3/1999 | Poplawski et al. | 438/138 |
| 6,056,573 * | 5/2000 | Nishioka | 439/326 |

FOREIGN PATENT DOCUMENTS 0 413 489 A2 * 6/1990 (EP) .
0 437 161 A2 * 11/1990 (EP) .
0 437 141 A2 * 12/1990 (EP) .
442 608 A2 * 8/1991 (EP) .
0 530 791 A2 * 9/1992 (EP) .
0 535 473 A1 * 9/1992 (EP) .
4239124 A1 * 11/1992 (EP) .
0 588 014 A2 * 7/1993 (EP) .

| | | |
|---|---|---|
| 0 662 259 B1 * | 9/1993 | (EP) . |
| 0 600 645 A1 * | 11/1993 | (EP) . |
| 0 613 032 A2 * | 2/1994 | (EP) . |
| 0 652 696 A1 * | 2/1994 | (EP) . |
| 0 656 696 A1 * | 2/1994 | (EP) . |
| 0 456 298 B1 * | 2/1996 | (EP) . |
| 0 314 651 A2 * | 10/1998 | (EP) . |
| 2 264 843 * | 8/1993 | (GB) . |
| 2 288 939 * | 12/1994 | (GB) . |
| 61-158046 * | 9/1986 | (JP) . |
| 61-188385 * | 8/1987 | (JP) . |
| 63-009325 * | 1/1988 | (JP) . |
| 63-16496 * | 2/1988 | (JP) . |
| 63-65967 * | 4/1988 | (JP) . |
| 63-65978 * | 4/1988 | (JP) . |
| 63-82998 * | 5/1988 | (JP) . |
| 1-237783 * | 9/1989 | (JP) . |
| 2-87837 * | of 1990 | (JP) . |
| 2-087837 * | 3/1990 | (JP) . |
| 2-151084 * | 6/1990 | (JP) . |
| 2-181710 * | 7/1990 | (JP) . |
| 2-278212 * | 11/1990 | (JP) . |
| 3-20458 * | 1/1991 | (JP) . |
| 3-94869 * | 4/1991 | (JP) . |
| 4-270305 * | 4/1991 | (JP) . |
| 4-50901 * | 2/1992 | (JP) . |
| 4-122905 * | 4/1992 | (JP) . |
| 4-165312 * | 6/1992 | (JP) . |
| 4-87809 * | 7/1992 | (JP) . |
| 4-211208 * | 8/1992 | (JP) . |
| 4-221207 * | 8/1992 | (JP) . |
| 4-229962 * | 8/1992 | (JP) . |
| 4-230978 * | 8/1992 | (JP) . |
| 4-109593 * | 9/1992 | (JP) . |
| 5-052802 * | 3/1993 | (JP) . |
| 4-234715 * | 5/1993 | (JP) . |
| 5-134147 * | 5/1993 | (JP) . |
| 5-290913 * | 5/1993 | (JP) . |
| 5-152607 * | 6/1993 | (JP) . |
| 5-188247 * | 7/1993 | (JP) . |
| 5-188250 * | 7/1993 | (JP) . |
| 5-211379 * | 8/1993 | (JP) . |
| 5-218581 * | 8/1993 | (JP) . |
| 5-70955 * | 9/1993 | (JP) . |
| WO 94/12900 * | 11/1990 | (WO) . |
| WO 90/14607 * | 6/1994 | (WO) . |

OTHER PUBLICATIONS

AMP Inc. "Lytel Molded–Optronic SC Duplex Transceiver-"Dec. 1993 from Catalog 65922.*
Amphenol Engineering News dtd 11/94 vol. 7 No. 6.*
AT&T Microelectronics, "1408–Type ODL Transceiver" Feb. 1994 preliminary data sheet.*
Baldwin and Kellerman, "Fiber Optic Module Interface Attachment"Research disclosure Oct. 1991.*
Block and Gaio "Optical Link Card guide/Retention Sys" Research Disclosures Apr. 1993.*
Cinch Hinge Connectors Catalog CM–16, Jul. 1963.*
Conductive Coatings by Dieter Gwinner no date.*
Encapsulation of Electronic Devices and Components by Edward R. Salmon.*
Hewlett–Packard Information for HP 5061–5800 Fiber Optic Interface converter including Declaration of Steve Joiner, Ph.D.*
Hewlett–Packard Optoelectronics Designer's Catalog (1991–1992).*
High Density Input/Output Connector Systems by Robert C. Herron no date.*

IBM Technical Disclosure Bulletin dated Mar., 1987 vol. 29 No. 10.*
IBM Fiber Channnel 266 Mb/sOptical Link Cards no date.*
James C. Pintner, Senior Attorney, Hewlett–Packard Company, letter dated Aug. 19, 1998.*
Japanese Standards Association's "Japanese Industrial Standard F04 Type Connectors for Optical Fiber Cords JIS C 5973" 1990.*
Leydig, Voit & Mayer, Ltd. letter to Methode Electronics from Mark E. Phelps, dated Jun. 21, 1999.*
Methode Electronics letter to Leydig, Voit & Mayer, Ltd. from David L. Newman, dated Jun. 30, 1999.*
Low Cost Fiber Physical Layer Medium Dependent Common Transceiver Footprint data sheet Jun. 23, 1992.*
Siemens, "Low–Cost ATM"Advertisement no date.*
Steve Joiner, Ph.D. Deposition Transcript and Exhibits dated May 12, 1998.*
Sumitomo Electric Fiber Optics Corp. "Transceiver Manufacturers to Support Common Footprint for Desktop FDDI Applications," pre release and Headsup–Sumitomo Electric Lightwave joins other in announcement Sumitomo Electric Fiber Optics Corp Product Bulletin–FDDI Optical Transceiver Preliminary Bulletin FDDI Optical Transceiver Module–Sumitomo Electric no date.*
Thomas & Betts Catalog 1988 for Info–Lan Moderm.*
Weik, "Communication Standard Dictionary" 1983 p. 454.*
Vixel Corporation's Response Chart (Methode Electronics, Inc. v. Vixel Corporation. C98 20237 RMW EAI) Including explanation of 5,717,533 and 5,734,558 and citation of additional references;prepard Oct. 16, 1998.*
Gigabit Interface Converter (GBIC) Revision 5.1A no date.*
Sumitomo Specifications ES9217–XC no date.*
HP Module HFBR–5103, EDDI Data Sheet no date.*
An Optical Data Link using a CD laser no date.*
CD Laser optical Data Links for Workstation and Midrange Computers no date.*
Minimizing Electrostatis Discharge to a Cartridge no date.*
Raylan Joins Low–Wavelength Push–850 nm Transceiver no date.*
Thomas & Betts INFO LAN Transceiver User Manual no date.*
BCP, Inc. 305 East Drive, Suite A, Melbourne, FL 32904, USA, "Techincal Article". . . no date.*
IBM OptoElectrnoic Enterprise: Oct. 1992 ANSI Meeting "A Performance for". . . no date.*
IBM OptoElectronic Enterprises: IBM/OEE Market Survey Only, "Shortwave". . . no date.*
IBM OptoElectronics Enterprise: RCL–2000 LCF–PMD: Preliminary. . . no date.*
IBM Technical Disclosure Bulletin "Optical Link Card Guide/Retention System" no date.*
Who provides Low–Cost Transceivers for all Standards?Siemens, undated no date.*
Sumitomo Electric Fiber Optics Corp., "Transceiver Manufacturers to Support". . . no date.*
FDDI Low–Cost Fiber Physical Layer Medium Dependent (LCF–PMD). . . .*
FDDI 1300nm Transceiver; Technical Data HFBR–5125.*

* cited by examiner

| Pin Name | Pin # | Sequence |
|---|---|---|
| RX-LOS | 1 | 2 |
| RGND | 2 | 2 |
| RGND | 3 | 2 |
| MOD_DEF(0) | 4 | 2 |
| MOD_DEF(1) | 5 | 2 |
| MOD_DEF(2) | 6 | 2 |
| TX_DISABLE | 7 | 2 |
| TGND | 8 | 2 |
| TGND | 9 | 2 |
| TX_FAULT | 10 | 2 |
| RGND | 11 | 1 |
| -RX_DAT | 12 | 1 |
| +RX_DAT | 13 | 1 |
| RGND | 14 | 1 |
| VddR | 15 | 2 |
| VddT | 16 | 2 |
| TGND | 17 | 1 |
| +TX_DAT | 18 | 1 |
| -TXD_DAT | 19 | 1 |
| TGND | 20 | 1 |

(prior art)

*Fig. 1*

| Pin Name | Pin # | Sequence |
|---|---|---|
| RX-LOS | 1 | 3 |
| RGND | 2 | 2 |
| RGND | 3 | 2 |
| MOD_DEF(0) | 4 | 3 |
| MOD_DEF(1) | 5 | 3 |
| MOD_DEF(2) | 6 | 3 |
| TX DISABLE | 7 | 3 |
| TGND | 8 | 2 |
| TGND | 9 | 2 |
| TX_FAULT | 10 | 3 |
| RGND | 11 | 1 |
| -RX_DAT | 12 | 1 |
| +RX_DAT | 13 | 1 |
| RGND | 14 | 1 |
| VddR | 15 | 2 |
| VddT | 16 | 2 |
| TGND | 17 | 1 |
| +TX_DAT | 18 | 1 |
| -TXD_DAT | 19 | 1 |
| TGND | 20 | 1 |

*Fig. 5*

MODIFIED CONTACT TRACES FOR INTERFACE CONVERTER

TECHNICAL FIELD

The present invention relates to a substrate of a transceiver module such as, but not limited, to a Gigabit Interface Converter (GBIC), and pluggability of that connector.

BACKGROUND

Optoelectronic transceiver modules provide for the bidirectional transmission of data between an electrical interface and an optical data link. The module receives electrically encoded data signals which are converted into optical signals and transmitted over the optical data link. Likewise, the module receives optically encoded data signals which are converted into electrical signals and transmitted onto the electrical interface. Copper transceiver modules provide bidirectional transmission of data between two electrical devices.

Normally, the transceiver is mounted onto one of the circuit card assemblies of a host computer, input/output system, peripheral device, or switch. Therefore, as with all electronic equipment, there is a need for a transceiver having an outer package design which occupies as little circuit card surface area as possible.

The gigabit interface converter (GBIC) specification was developed by a group of electronics manufacturers to arrive at a standard small form factor transceiver module for use with a wide variety of serial transmission media and connectors. The specification defines the electronic, electrical, and physical interface of removable serial transceiver module designed to operate at a giga-bit speed. A GBIC provides a pluggable module which may be inserted and removed from a host or switch chassis without powering off the receiving socket. The GBIC specification allows a single standard interface to be changed from a first serial medium to an alternate serial medium by removing a first GBIC module and plugging in a second GBIC having the desired alternate media interface.

According to the GBIC specification, the connection of the GBIC to the circuit board in the host enclosure (the host board) is identical for all implementations, regardless of external media type. For example, a GBIC with a DB9 connector can be replaced with a GBIC with an Single Connector (SC) duplex media connector. The mechanical form factor of the GBIC with reference to the host board is always the same. While not requiring a fixed form factor guide-rail or slot, common components are available that will suffice for most applications. Special socketing components can be built as required. Every GBIC will fit into a socket designed for any other GBIC. Further, the power interface includes two guide tabs integrated into the connector structure. The guide tabs shall be connected to circuit ground on both the host and GBIC. If the Transmitting Ground (TGND) and Receiving Ground (RGND) pins are separated on the GBIC, one guide tab shall be connected to TGND and the other to RGND. The guide tabs shall engage before any of the connector pins. This harmlessly discharges any stray static. The connector itself has two stages of contact sequencing, sequence stage 1 making contact before sequence 2 during insertion. Grounds and certain signals make contact in sequence stage 1. Power makes contact in stage 2. FIG. 1 shows the sequence of connections including the pin name, pin number, and the sequence of connection. When the GBIC is plugged in to a host circuit board, the numeral '1' denotes pins which make contact before pins denoted by numeral '2.' It may be noted that a preliminary step before stage 1 occurs when the GBIC external surface contacts the face plate opening or ground tabs of the receptacle of the host device in order to discharge static to chassis ground.

When a GBIC is hot plugged, several of the signal lines are connected at the same time as the power Vdd. This can cause a dangerous situation, especially with a GBIC having a module definition "4" which uses a Complementary Metal Oxide-Silicon (CMOS) serial EEPROM. The data and clock lines of the (Version 2) (SCA2) Electrically Erasable Programmable Read-Only Memory (EEPROM) Single Connector Attachment are connected through an connector. Connecting these signal lines to the EEPROM at the same time as Vdd can cause this EEPROM to malfunction or even be destroyed, and with it the GBIC.

SUMMARY OF THE INVENTION

Objects of the invention include safe hot plugging of a gigabit interface connector for exchanging data signals between two transmission media.

The present invention relates to an externally accessible, hot-pluggable communications circuit module and universal module guide system, and more particularly to interchangeable serial communications transceivers, employing transmission media such as fiber optics and copper wire at a wide range of frequencies and wavelengths. The transceiver circuits are housed in a standardized module housing and interfacing with a host system through a universal module guide. The module and module guide system meet standard EMI specifications and provide discharge paths for ESD build-up during handling, and pin sequencing to prevent power surges during hot plugging.

The present invention relates to a high speed serial interface module, such as a gigabit interface converter (GBIC) module, configured to slide into a slot within a host device chassis where, at the rear of the mounting slot, a first connector of the GBIC engages a host socket of the host device. According to the present invention, the first connector includes sequential mating contacts on a contact beam of a substrate such that when the module is inserted into the corresponding host socket, certain contacts are connected in a predefined sequence such that a first set of contacts engages the host socket prior to a second set of contact traces which, in turn, engage the host socket prior to a third set of contact traces. In further accord with the present invention, the first set includes grounding contacts, the second set includes contacts for powering the substrate and the third set includes signal contacts. In one embodiment, the gigabit interface converter has contacts in a predefined sequence, instead of contact traces on a substrate which are in a predefined sequence. An advantage of this invention is that the GBIC, and its EEPROM, is grounded before it is powered and powered before it begins passing signals. This eliminates the risk of damage to the GBIC EEPROM under the GBIC-to-host contact sequence which is dictated by the GBIC specification.

By properly sequencing the power and grounding connections the module may be "hot pluggable," in that the module may be inserted into and removed from a host socket without removing power to the host device. The various contact elements of the first electrical connector are connected to conductive traces on the printed circuit board, and thus serial data signals may be transferred from the host device to the interface module.

The substrate includes electronic components necessary to transfer data signals between the copper transmission medium of the host device to the transmission medium connected to the output side of the module. These electronic components may include passive components such as capacitors and resistors for those situations when the module is merely passing the signals from the host device to the output medium without materially changing the signals, or they may include active components for those cases where the data signals must be altered before being transferred to the output medium.

These and other objects, features and advantages will become more apparent in light of the drawings and accompanying text.

BRIEF DESCRIPTION OF THE DRAWINGS

FIG. 1 is a table of a sequence of pin connections according to a GBIC specification.

FIG. 5 is a table of a sequence of pin connections according to the present invention

DETAILED WRITTEN DESCRIPTION OF A PRESENTLY PREFERRED EMBODIMENT

The present invention relates to an electrical connector for connecting a peripheral computer device to an active communication bus. The invention allows the peripheral device to be connected to the bus without removing power to the bus prior to making the connection. Such "hot-plugging" is accomplished without data errors, or "glitches" being created on the bus due to a voltage drop on the signal lines as the signal line voltage is diverted to charging the uncharged capacitance of the peripheral device circuits.

Figure 2:
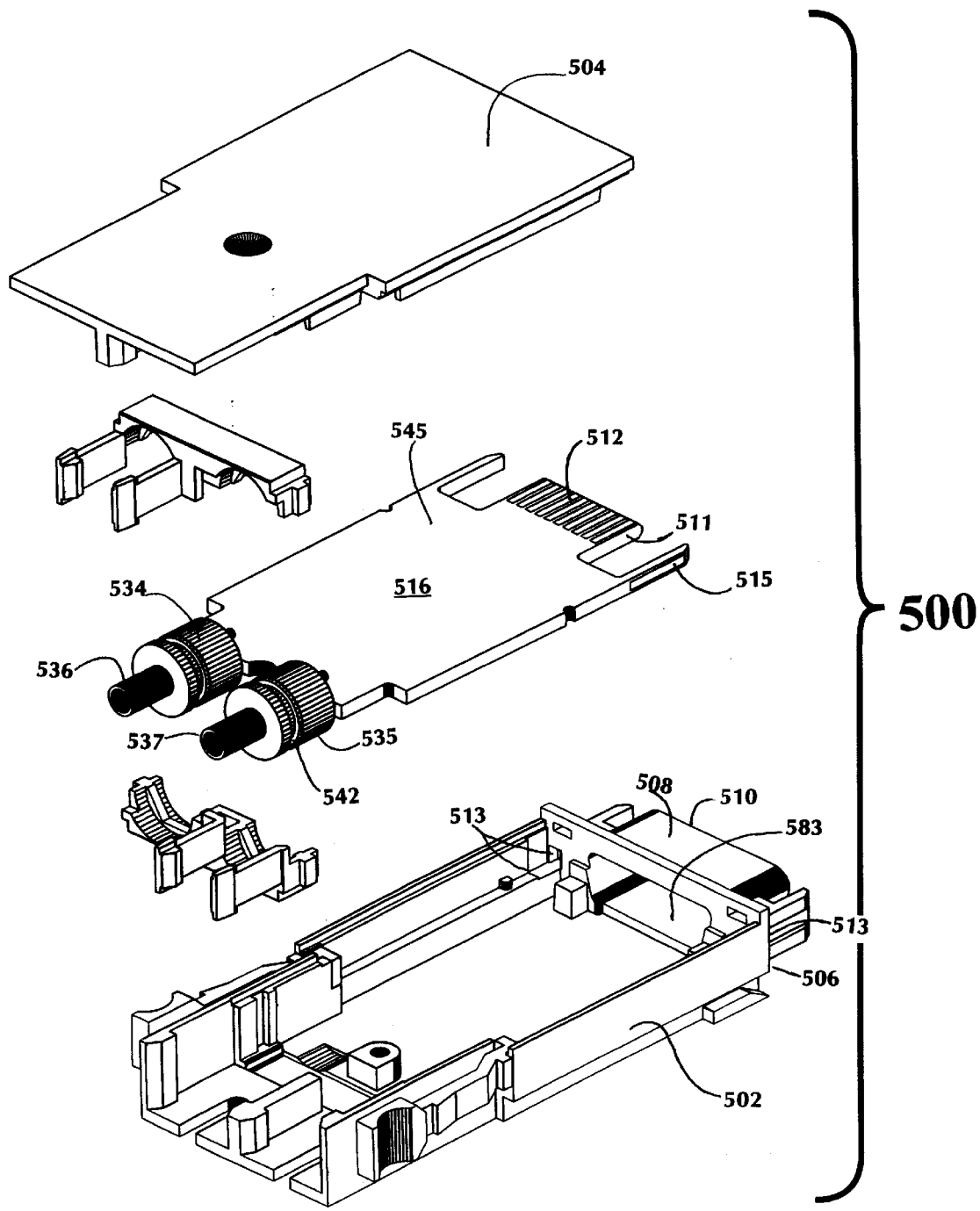
FIG. 2 is an isometric exploded view of an optical GBIC including an SCA2 style connector.

FIG. 2 discloses an exploded isometric view of an interface converter module 500. Generally, the module 500 converts electrical signals to or from optoelectronic signals. However, the present invention includes a copper GBIC as one embodiment. Most of the elements disclosed in FIG. 2 that are relevant to the present invention are the same for a copper media GBIC or an optical media GBIC. The module 500 includes a cover 504, a substrate 516 and a base 502. At the first end of the module 506 on the base is an integrally formed connector 510 for connecting with a host device. As previously discussed, this connector includes a D-shaped shroud 508 for receiving a contact beam 511 of the substrate 516. The contact beam 511 includes contact traces 512 that are inserted within the shroud 508 in order to form a pluggable male ribbon style connector 510. The present invention also applies to a discrete SCA-2 connector that is mounted to the module housing. As discussed above, the base 502, in a preferred embodiment, is formed of a die-cast metal and the connector 510 is also formed of one-piece with the base 502 of the die-cast metal. As discussed above, the substrate also includes guide tabs 515 which are inserted into apertures 513 of the base 502. Contact beam 511 is located at the first end 545 of the printed circuit board.

At the second end 546 of the substrate is located a first optical subassembly 534 and a second optical subassembly 535. In a preferred embodiment, the first optical subassembly 534 is a Transmitting Optical Subassembly (TOSA) including a Vertical-Cavity Surface-Emitting Laser (VCSEL). However, any type of optical transmitting device may be used including an LED or other surface emitting laser. In a preferred embodiment, the second optical subassembly 535 is a Receiving Optical Subassembly (ROSA) and includes a photo diode. However, any type of optical receiving material may be used. The optical subassemblies 534, 535 are mounted at the second end 546 of the substrate 516 and are electrically connected to the circuitry and components on the substrate 516 and provide for the conversion of signals as discussed above for the Giga-Bit Converter specification. Protruding from the optical subassembly 534, 535, are ferrule receiving barrels 536, 537, respectively.

Figure 3:
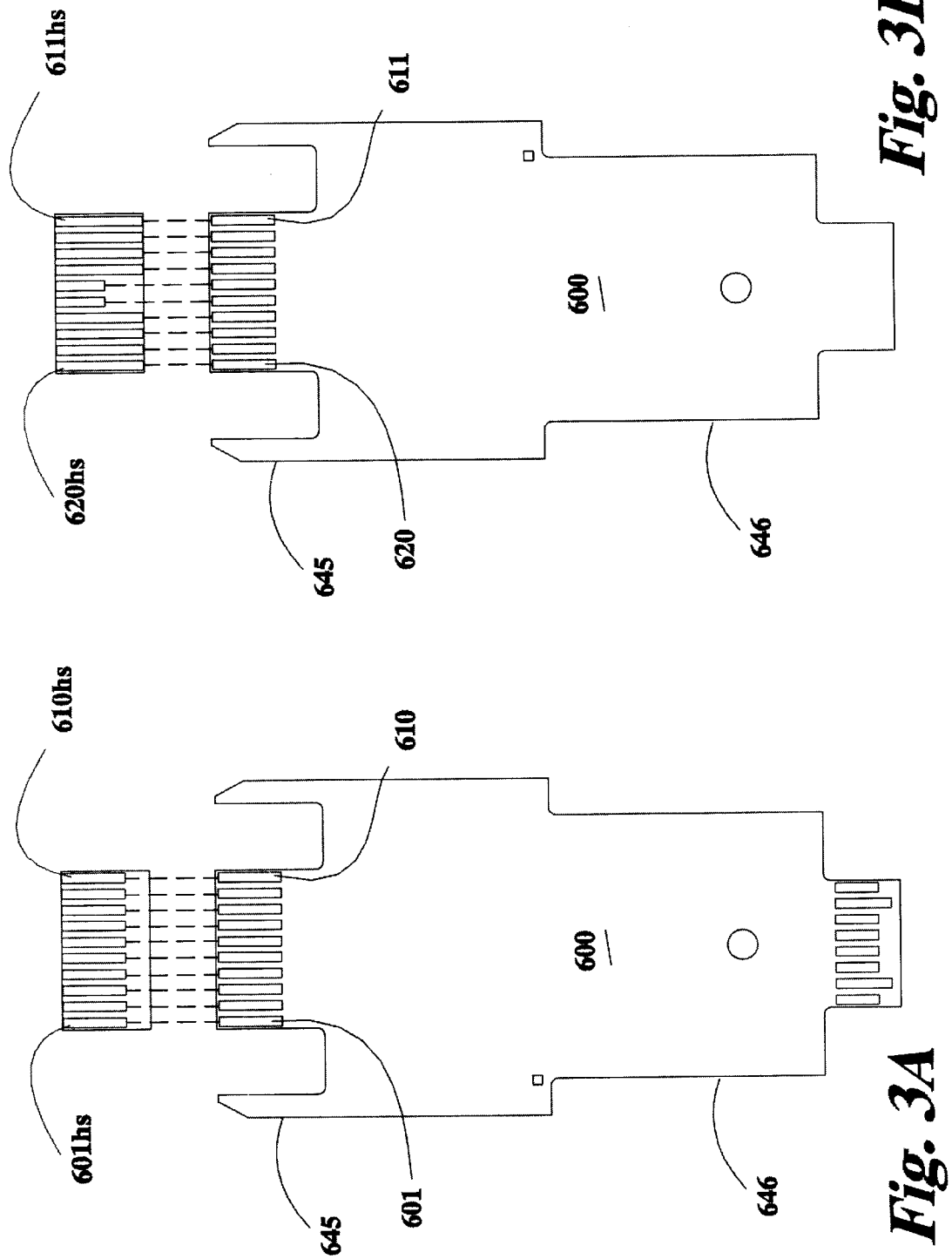
FIGS. 3A, B shows a circuit board for a copper GBIC according to the GBIC specification.

FIGS. 3A, B show contact traces 601–620. In order that the GBIC may plug into a host socket as indicated in the GBIC specification, a first set of contact traces 611–14, 617–620 begin at the edge of board 600 at the first end 645 which is analogous to first end 545 in FIG. 2, and opposite a second end 646 which is analogous to a second end 546 in FIG. 2. In contrast to the first set of contacts, a second set of contacts 601hs–610hs and 15hs and 16hs are set back from the edge of the connector 810 (see FIG. 8). Contact traces 601–620 on the board 600 of the GBIC mate with contacts 601hs–620hs, respectively, the designation 'hs' indicating 'host socket.'

Figure 6:
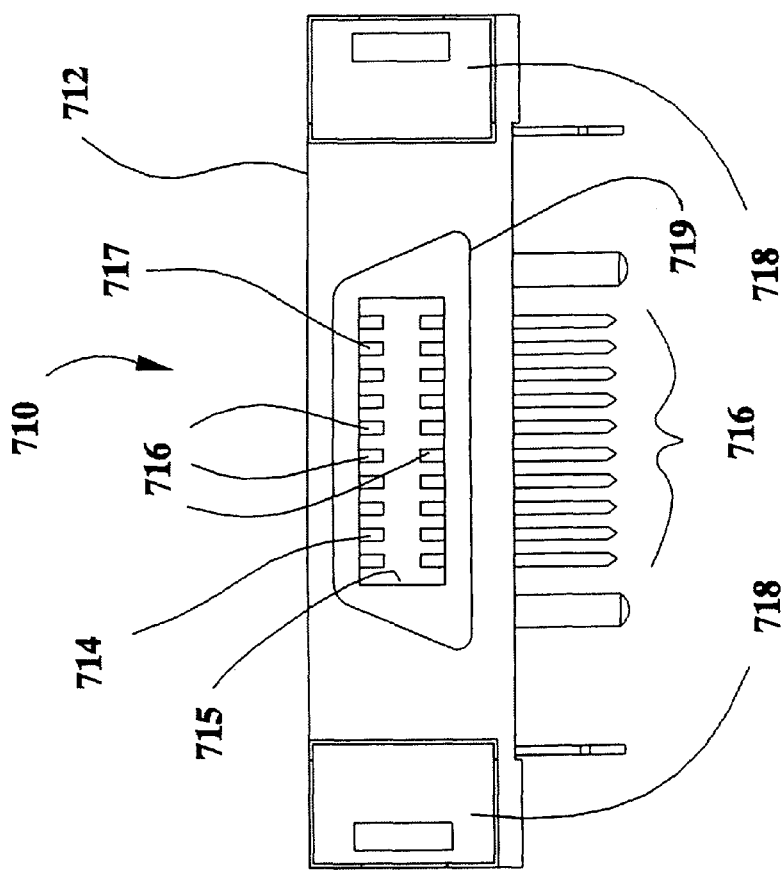
FIG. 6 is a front view of a host socket.
Figure 7:
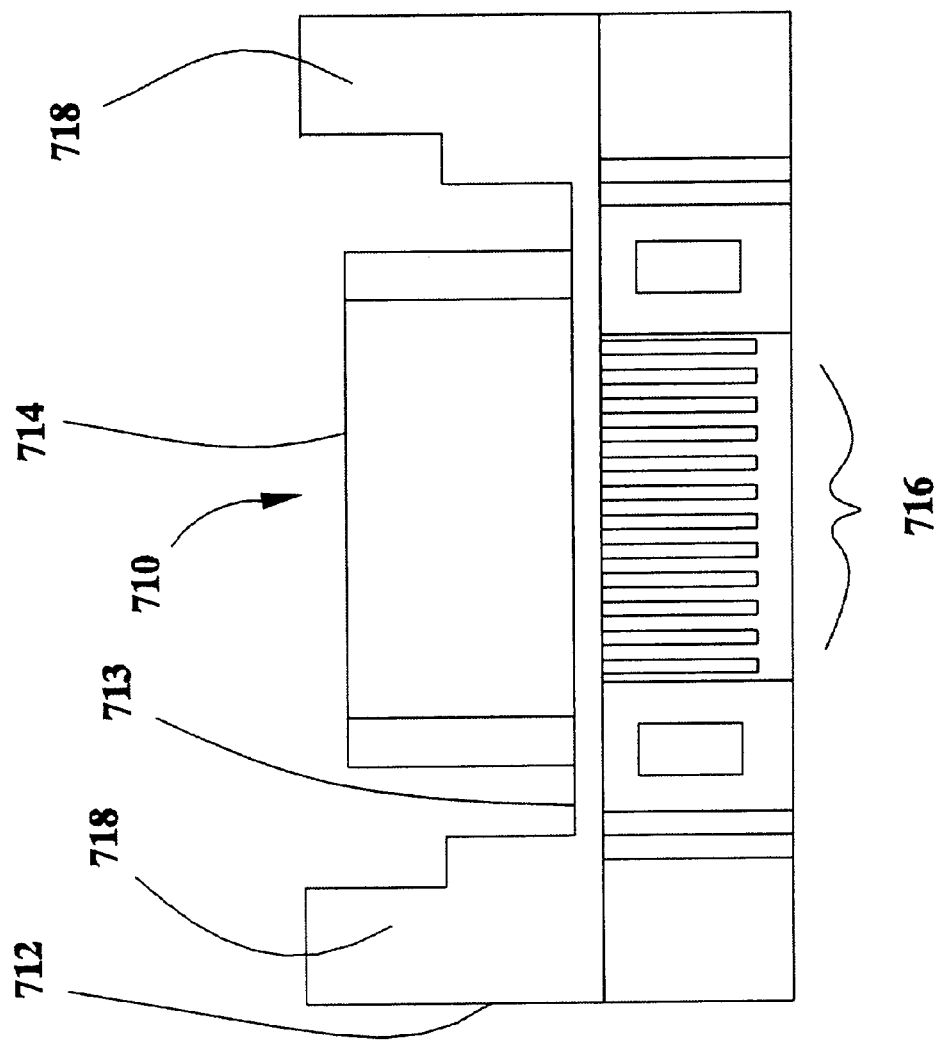
FIG. 7 is a top view of a host socket.

FIGS. 4A, B show in detail the substrate 516 according to the invention. It is quite different from the substrate 600 in FIG. 3A, B because of the contact traces 512 adjacent first end 545 on board 516a,b which face a host socket 710. Contact traces 1–20 on the board 516 of the GBIC mate with traces 1hs–20hs, respectively, 'hs' indicating 'host socket.' The host socket 710 is shown in FIGS. 6, 7. The set of contact traces 512 is divided into two further contact sets according to the present invention. FIG. 4A shows the top of the board or substrate 516a and FIG. 4B shows the bottom of the board or substrate 516b. So that the GBIC may plug into a host socket 710a,b, a first set of contact traces 11–14, 17–20 begin at the edge of the board 516b and comprise a first set of contact traces which engage a host socket 710b before any other traces on board 516b. Because contacts 15 and 16 of host 710b are offset, the corresponding traces 15 and 16 of board 516b make electrical connection after contact traces 11–14 and 17–20. Another set of contact traces of board 516a contact the host socket 710a. These traces include contact traces 2, 3, 8, 9 of board 516a and are flush to the edge of the board 516a. This set of contact traces of board 516a contact the host 710a first in sequence of the contact traces of board 516a. A second set of contact traces of board 516a mate with the socket after the first set and includes contact traces 1, 4, 5, 6, 7 and 10.

FIG. 5 is a table of a sequence of contact according to the present invention and the location of the contact traces in FIGS. 4A, 4B. The sequence indicates when contact traces 1–20 of FIGS. 4A, B on board 516 mate with mating contacts 1hs–20hs of a host socket, shown in FIGS. 6, 7 as host socket 710 which is a female ribbon style connector. FIG. 5 should be contrasted with the teaching of the GBIC specification in FIG. 1, a teaching which represents the state of the art on the point the invention addresses.

Figure 4:
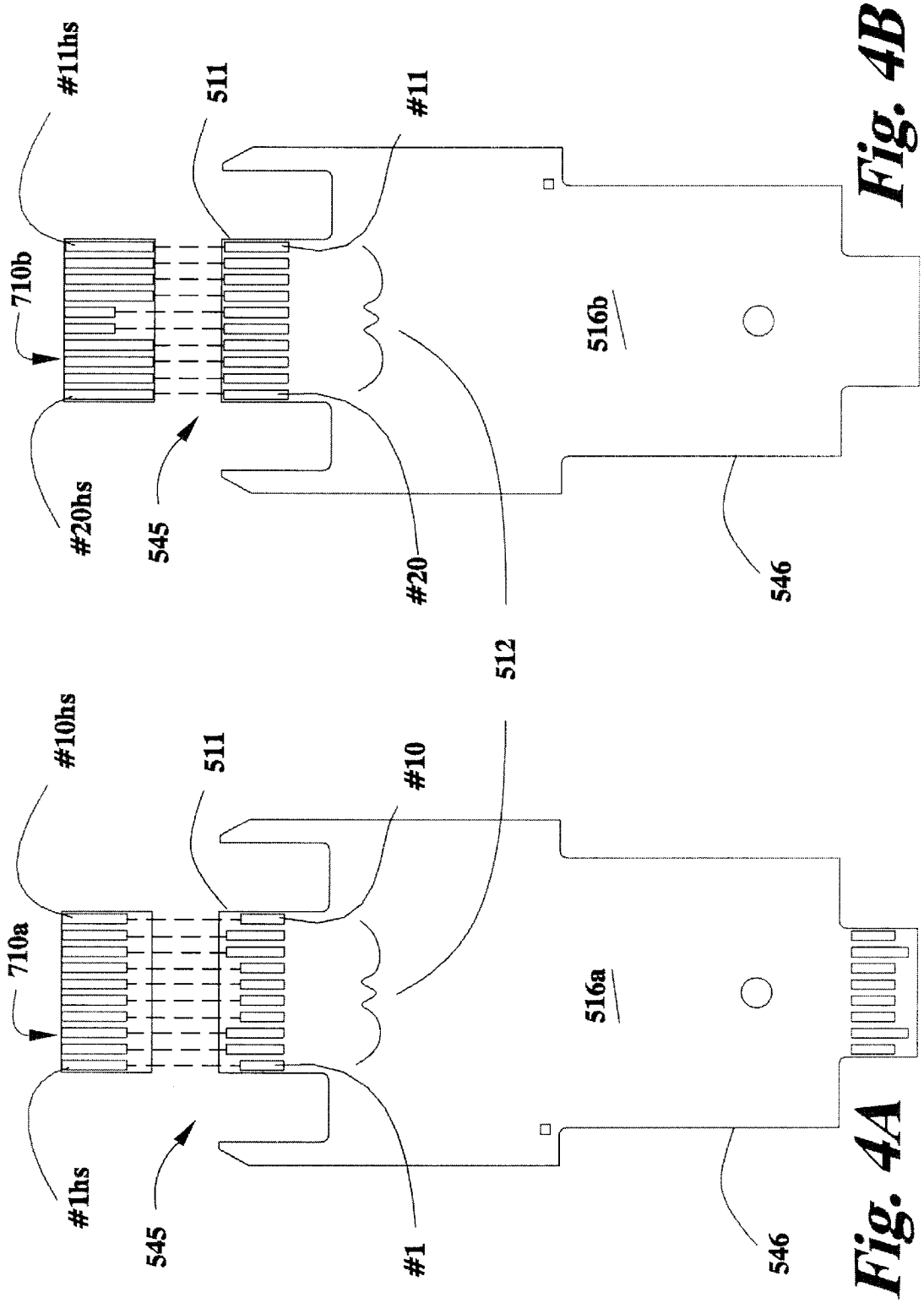
FIGS. 4A, B show a circuit board according to the present invention.

FIGS. 6, 7 show a host socket 710 configured to mate with the male connector 510 of FIG. 2. Host socket 710 includes a housing 712 and a shroud 714 extending from a front surface 713 of the housing. Shroud 714 is formed as a D-shell, slightly smaller than the D-shell shroud 508 of male connector 510, such that shroud 714 is insertable into a contact cavity 583 of the connector of FIG. 2. Shroud 714 also defines a contact cavity 715. A plurality of mating contacts 716 are arrayed adjacent the upper surface 717 and lower surface 719 defining contact cavity 715. In a preferred embodiment an SCA-20 pin type connector may be used. There is a one to one correspondence between the contacts 716 and their respective mates, the contact traces 1–20 of the board of FIGS. 4A, B. Thus, the contacts 716 are the 'hs' contacts referred to in FIGS. 4A, B. The mating contacts 716 adjacent lower surface 719 are spaced apart from the contacts 716 adjacent upper surface 717, creating a narrow gap therebetween. Thus, contact cavity 715 is configured to receive contact beam 511 of substrate 516 as shown in FIGS. 2, 4. Tabs 515 of the substrate 516 in FIG. 2 are received in tab slots 718. Mating contacts 716 in contact cavity 715 emerge out of the back end of host socket 710 where they can connect to a motherboard. Only ten such contacts are shown emerging because some mating contacts 716 hide other mating contacts 716. Contact traces on the substrate 516 engage mating contacts 716 when the male connector 510 of FIG. 2 engages the host socket 710 shown in FIGS. 6, 7.

Figure 8:
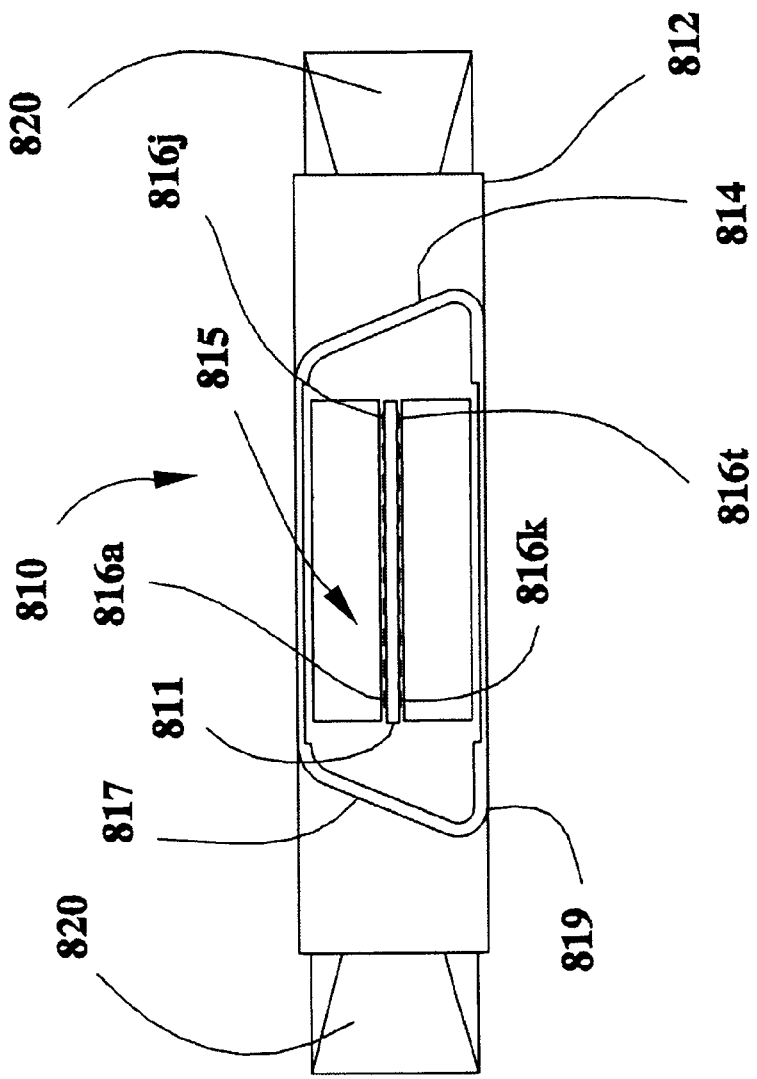
FIG. 8 is a front view of a GBIC plug connector.

The contact traces shown in FIG. 4A,B illustrate the lengths of the contacts on the end of a GBIC substrate to achieve the sequence connection illustrated in FIG. 5. Similarly, in FIG. 8 the same sequence of connections illustrated in FIG. 5 may be achieved by varying the lengths of the contacts in a host plug electrical connector. FIG. 8 shows an SCA2 style GBIC plug 810 configured to mate with an SCA2 socket such as that shown in FIGS. 6, 7. GBIC plug 810 includes a housing 812 and a shroud 814 extending from a front surface 813 of the housing. Shroud 814 defines a contact cavity 815. A plurality of mating contacts 816*a–j* are arrayed adjacent the upper surface 817 and another plurality 816*k–t* on the lower surface 819 defining contact cavity 815. There is a one to one correspondence between the pin numbers 1–20 in FIG. 5 and 816*a–t*. This is because in FIG. 8, the contacts 816*a–t* have a similar structure to perform a similar function; they are GBIC plug metallic elements, connected to circuit elements on a substrate in that plug, which by virtue of their length or some other structural feature are caused to mate in a predefined sequence. That sequence is specified in FIG. 5. The mating contacts 816 adjacent lower surface 819 are spaced apart from the contacts 816 adjacent upper surface 817 by contact beam 811. Thus, contact beam 811 functions the same way as does the contact beam 511 in FIG. 2. Mating contacts 716 in contact cavity 715 emerge out of the back end of host socket 710 where they connect to a motherboard. Contact traces on the substrate 516 engage mating contacts 716 when the male connector 510 of FIG. 2 engages the host socket 710 shown in FIGS. 6, 7. Grounding posts 820 protrude from either side of the host plug 810.

Furthermore, it should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

What is claimed is:

1. A Gigabit Interface Converter (GBIC) comprising:

a GBIC housing having a first end, said first end facing a host device when said GBIC is engaged in a host socket of said host device;

a substrate having a first end mounted within the GBIC housing for plugging into the host socket of the host device;

guide tabs on a first and second side of the first end of the substrate for plugging into the host socket, at least one of said first and second said guide tabs including a contact electrically connected to Receiving Ground (RGND) and Transmitting (TGND) of the GBIC;

a first set of contacts, distributed on a surface of the substrate adjacent said first end for engaging contact elements in said host socket, said first set of contacts beginning a first distance from the edge of the first end of the substrate and being electrically connected to a power line of the GBIC;

a second set of contacts, distributed on the surface of the first end of the substrate adjacent to the first end for engaging contact elements in the host socket, the second set of contacts beginning a second distance from the edge of the first end of the substrate and being electrically connected to a signal line of the GBIC; and during insertion of the GBIC into the host socket, the guide tabs electrically engage the host socket first, the first set of contacts electrically engages the host socket second, and the second set of contacts electrically engages the host socket third.

2. The Gigabit Interface Converter (GBIC) of claim 1 wherein the first and second set of contacts on said substrate are provided on a top surface of said substrate and a bottom surface of said substrate.

3. The Gigabit Interface Converter (GBIC) of claim 1 wherein the first set of contacts includes a male ribbon style connector, and the second set of contacts include a cooperating female ribbon style connector.

4. A Gigabit Interface Converter (GBIC), comprising:

a housing;

a substrate mounted within the housing having a first end for plugging into a host socket of a host device;

guide tabs on a first and second side of the first end of the substrate for guiding the substrate into the host socket, the first and second guide tabs including a contact electrically connected to Transmitting Ground (TGND) of the GBIC;

a first set of contacts on the surface of the substrate beginning a first distance from the edge of the first end of the substrate and being electrically connected to a power line of the GBIC;

a second set of contacts on the surface of the substrate beginning a second distance from the edge of the first end of the substrate and being electrically connected to a signal line of the GBIC; and during insertion of the GBIC in the host socket, the guide tabs electrically connect to the host socket first, the first set of contacts electrically connect with the host socket second, and the second set of contacts electrically connect with the host socket third.

5. The GBIC of claim 4, wherein the first and second set of contacts include ribbon style connectors.

6. The GBIC of claim 4, wherein the first set of contacts is on an a top surface of the substrate, and the second set of contacts is on a bottom surface of the substrate.

7. The GBIC of claim 4, wherein the guide tabs and the first and second set of contacts electrically connect in sequence the following pin designations of the GBIC with the host socket:

| PIN | SEQUENCE |
|---|---|
| (1) RX-LOS | Third |
| (2) RGND | Second |
| (3) RGND | Second |
| (4) MOD_DEF(0) | Third |
| (5) MOD_DEF(1) | Third |
| (6) MOD_DEF(2) | Third |
| (7) TX_Disable | Third |
| (8) TGND | Second |
| (9) TGND | Second |
| (10) TX_FAULT | Third |
| (11) RGND | First |
| (12) −RX_DAT | First |
| (13) +RX_DAT | First |
| (14) RGND | First |
| (15) VddR | Second |
| (16) VddT | Second |
| (17) TGND | First |
| (18) +TX_DAT | First |
| (19) −TX_DAT | First |
| (20) TGND | First. |

8. The GBIC of claim 4, wherein the guide tabs are electrically connected to TGND.

9. The GBIC of claim 4, further comprising:

a optoelectronic transceiver enabling the GBIC to interface with an optical data link.

10. The GBIC of claim 4, further comprising:

a copper transceiver enabling the GBIC to interface with a copper wire data link.

11. A method of hot-plugging a Gigabit Interface Converter (GBIC) into a host socket, comprising the sequential steps of:

a) connecting guide tabs of the GBIC to contact elements of the host socket in order to establish an electrical connection between a ground contact of the GBIC with that of the host socket;

b) connecting a first set of contacts of the GBIC to contact elements of the host socket in order to establish an electrical connection between the power lines of the GBIC with those of the host socket; and c) connecting a second set of contacts of the GBIC to contact elements of the host socket in order to establish an electrical connection between the signal lines of the GBIC with those of the host socket.

12. The method of claim 11, further comprising the first step of:

engaging a housing of the GBIC with an outer surface of the host socket in order to establish an electrical connection between chassis ground of the GBIC with that of the host socket.

13. The method of claim 11, further comprising the first step of:

engaging a housing of the GBIC with an outer door of the host socket in order to establish an electrical connection between chassis ground of the GBIC with that of the host socket.

14. A transceiver module, comprising:

a housing having a first end, said first end facing a host device when the transceiver module is engaged in a host socket of the host device;

a substrate, mounted within the housing, having a first end for plugging into the host socket of the host device;

guide tabs on a first and second side of the first end of the substrate for plugging into the host socket, at least one of said first and second said guide tabs including a contact electrically connected to a signal ground;

a first set of contacts, distributed on a surface of the substrate adjacent said first end for engaging contact elements in said host socket, said first set of contacts beginning a first distance from the edge of the first end of the substrate and being electrically connected to a power line of the transceiver module;

a second set of contacts, distributed on the surface of the first end of the substrate adjacent to the first end for engaging contact elements in the host socket, the second set of contacts beginning a second distance from the edge of the first end of the substrate and being electrically connected to a signal line of the transceiver module, and during insertion of the transceiver module into the host socket, the guide tabs electrically engage the host socket first, the first set of contacts electrically engages the host socket second, and the second set of contacts electrically engages the host socket third.

* * * * *